United States Patent [19]

Murakoshi

[11] 4,455,575

[45] Jun. 19, 1984

[54] TWO-DIMENSIONAL SOLID-STATE IMAGE SENSOR

[75] Inventor: Makoto Murakoshi, Tokyo, Japan

[73] Assignee: Fuji Photo Film Co., Ltd., Minami-Ashigara, Japan

[21] Appl. No.: 379,494

[22] Filed: May 18, 1982

[30] Foreign Application Priority Data

May 19, 1981 [JP] Japan .................................. 56-75489

[51] Int. Cl.³ .............................................. H04N 3/15
[52] U.S. Cl. .................................................... 358/213
[58] Field of Search .................... 358/213, 212, 44; 357/30; 250/211 J, 578

[56] References Cited

U.S. PATENT DOCUMENTS 4,320,413  3/1982  Takemura ........................... 358/213
4,336,556  6/1982  Sekine ................................. 358/213
4,360,833  11/1982  Kinoshita ........................... 358/213

Primary Examiner—Michael A. Masinick

[57] ABSTRACT

A two-dimensional solid-state image sensor which yields video signals of odd and even number fields of the same exposure timing. Two vertical transfer paths are provided for each column of optoelectro transducers arranged in a matrix form, and stored information of the optoelectro transducers of the odd and even number rows are simultaneously transferred to separate vertical transfer paths. The stored information of the even number row is temporarily held in the vertical transfer path, and the stored information of the odd number row is read out as a video signal of an odd number field first and then the stored information of the even number row is read out as a video signal of an even number field.

4 Claims, 8 Drawing Figures

TWO-DIMENSIONAL SOLID-STATE IMAGE SENSOR

BACKGROUND OF THE INVENTION

1. Field of the Invention

The present invention relates to a two-dimensional solid-state image sensor which yields a video output fit for a display system employing an interlaced scanning system.

2. Description of the Prior Art

An ordinary TV system uses a 2:1 interlaced scanning system in which one picture frame (each frame period being 1/30 or 1/25 sec) is represented by two fields. In order to make the two-dimensional solid-state image sensor fit for the existing system, it is necessary that the image sensor produces a video output of the type fit for the interlaced scanning system.

To meet such a requirement, in a conventional two-dimensional solid-state image sensor, such as a CCD image sensor of an interline transfer arrangement, information stored in odd number rows of plural optoelectro transducers $P_{11}$ to $P_{mn}$ arranged in a matrix form, for example, as shown in FIG. 1, is transferred via a transfer gate 101 to a vertical transfer path 100 provided for each column and taken out as a video signal of an odd number field via the vertical transfer path 100 and a horizontal transfer path 102. Then, stored information of the optoelectro transducers of the even number rows is transferred via the transfer gate 101 to the vertical transfer path 100 and taken out as a video signal of an even number field via the vertical transfer path 100 and the horizontal transfer path 102. FIG. 2 shows the timing for exposure of the optoelectro transducers of the odd and the even number rows and the timing for vertical transfer of their information. For instance, in the case of the exposure time being 1/30 sec, the exposure periods of the optoelectro transducers of the odd and even number rows are staggered 1/60 sec so that the vertical transfer of information of either one of the odd and even number rows is finished within the exposure time of the other.

Incidentally, there is now a strong demand for obtaining a still picture of a desired frame of a moving picture and, to meet this demand, many of recent video systems are provided with a still picture mechanism for obtaining a still picture. In conventional two-dimensional solid-state image sensors, however, there is a lag in the exposure timing of the odd and even number fields as described above, so that if one frame is formed with two fields by reproducing the odd and even number fields alternately, then misregistration is introduced in the picture in the case of the subject to be televised being a moving one, resulting in the picture flickering and hence becoming unstable. To avoid this, the existing video systems is designed so that when to produce a still picture, only one field is usually reproduced; however, this reduces resolution by half, leading to a defect of degraded picture quality.

SUMMARY OF THE INVENTION

It is therefore an object of the present invention to provide a two-dimensional solid-state image sensor which is designed to produce a video output fit for a display system using the interlaced system to create a still picture of high quality.

Another object of the present invention is to provide a two-dimensional solid-state image sensor which is able to increase the picture quality of a still picture by a purely electronic method.

Yet another object of the present invention is to provide a two-dimensional solid-state image sensor which is adapted to prevent lowering of its sensitivity through utilization of optoelectro transducers of high aperture ratio structure.

Briefly stated, the two-dimensional solid-state image sensor of the present invention is provided with a plurality of optoelectro transducers arranged in a matrix form, first and second vertical transfer paths provided corresponding to each column of transducers, a horizontal transfer path for serial-parallel converting signals transferred via the first and second vertical transfer paths to output the converted signals, gate means for simultaneously transferring stored information of the optoelectro transducers of odd and even number rows of the columns of the transducers to the first and second transfer paths, respectively, and a transfer controller for performing transfer control of the first and second vertical transfer paths and the horizontal transfer path, by which the stored information of the optoelectro transducers of the odd number rows transferred to the first vertical transfer path is outputted as a video signal of an odd number field first and then the stored information of the optoelectro transducers of the even number rows transferred to the second vertical transfer path is outputted as a video signal of an even number field. With such an arrangement, since the video signals of the odd and even number fields are of the same exposure timing, even if one frame is formed with two fields by reproducing the odd and even number fields alternately, a flicker-free still picture of high quality can be obtained.

DESCRIPTION OF THE PREFERRED EMBODIMENTS

Figure 1:
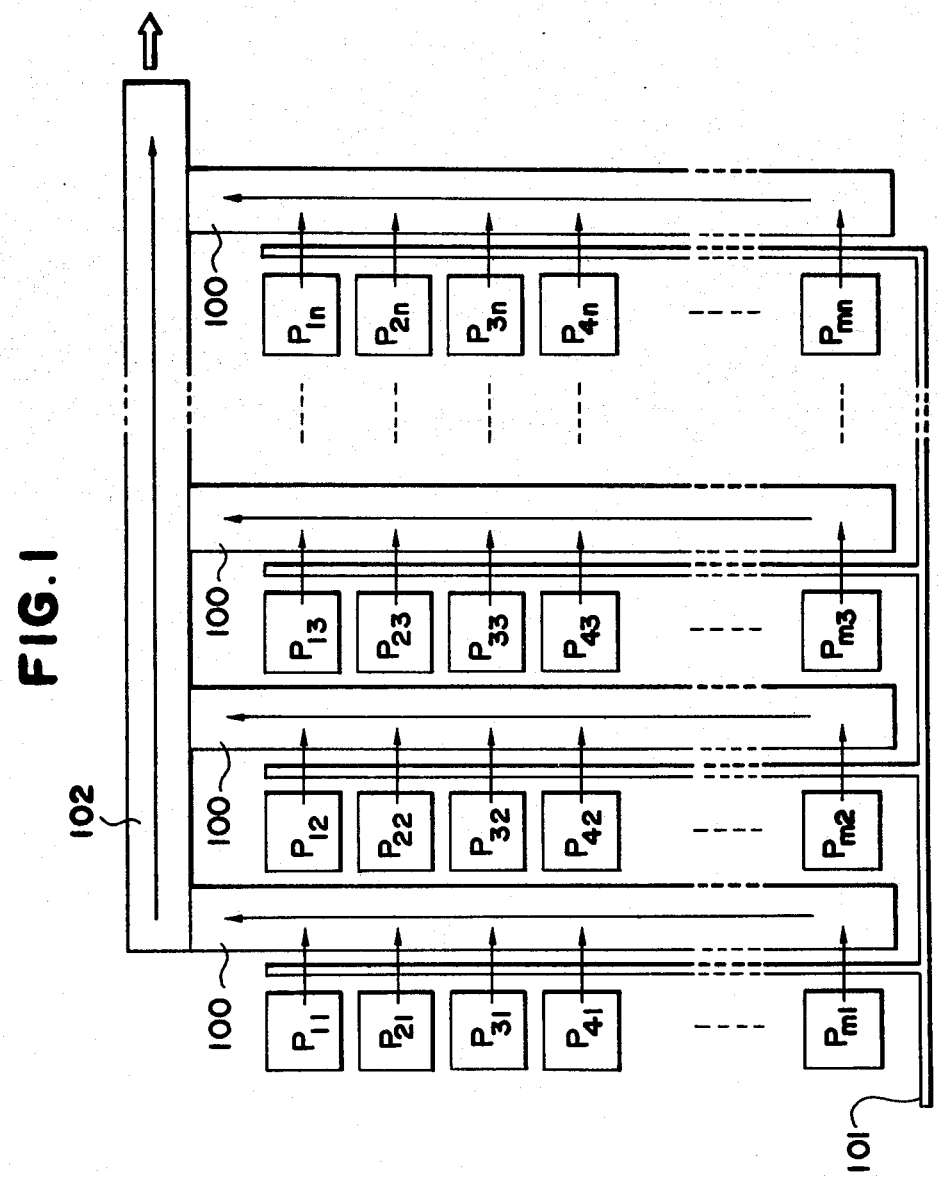
FIG. 1 is explanatory of the arrangement of a conventional two-dimensional solid-state image sensor.
Figure 2:
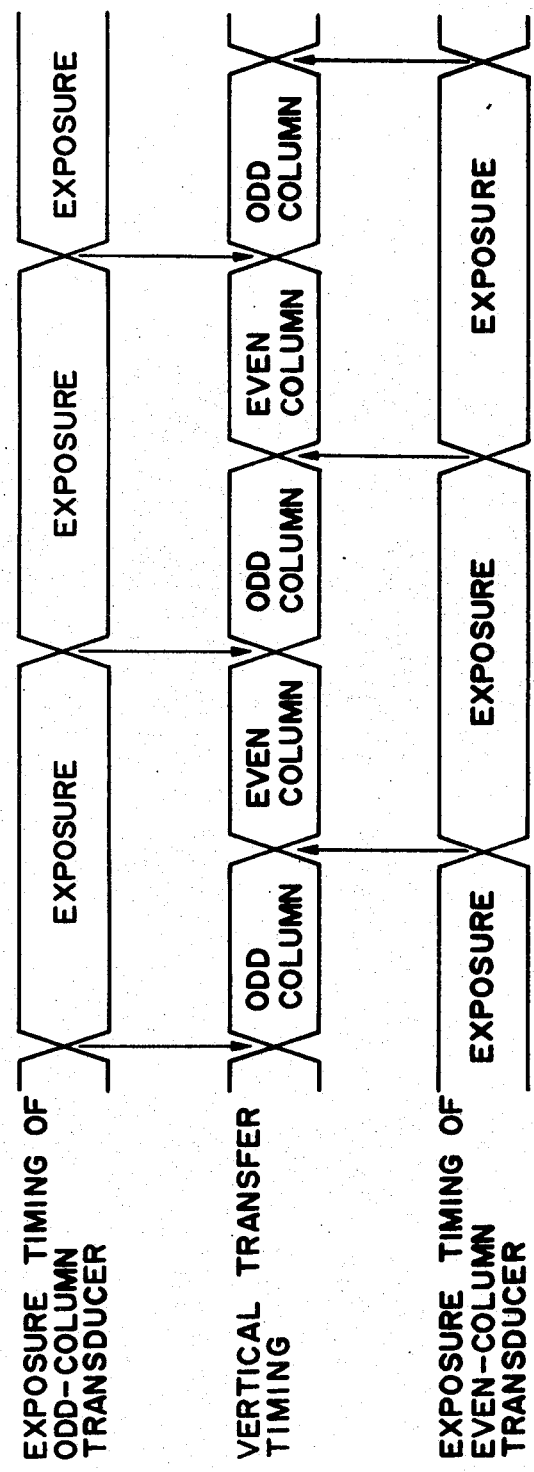
FIG. 2 is explanatory of the operation of the image sensor depicted in FIG. 1.
Figure 3:
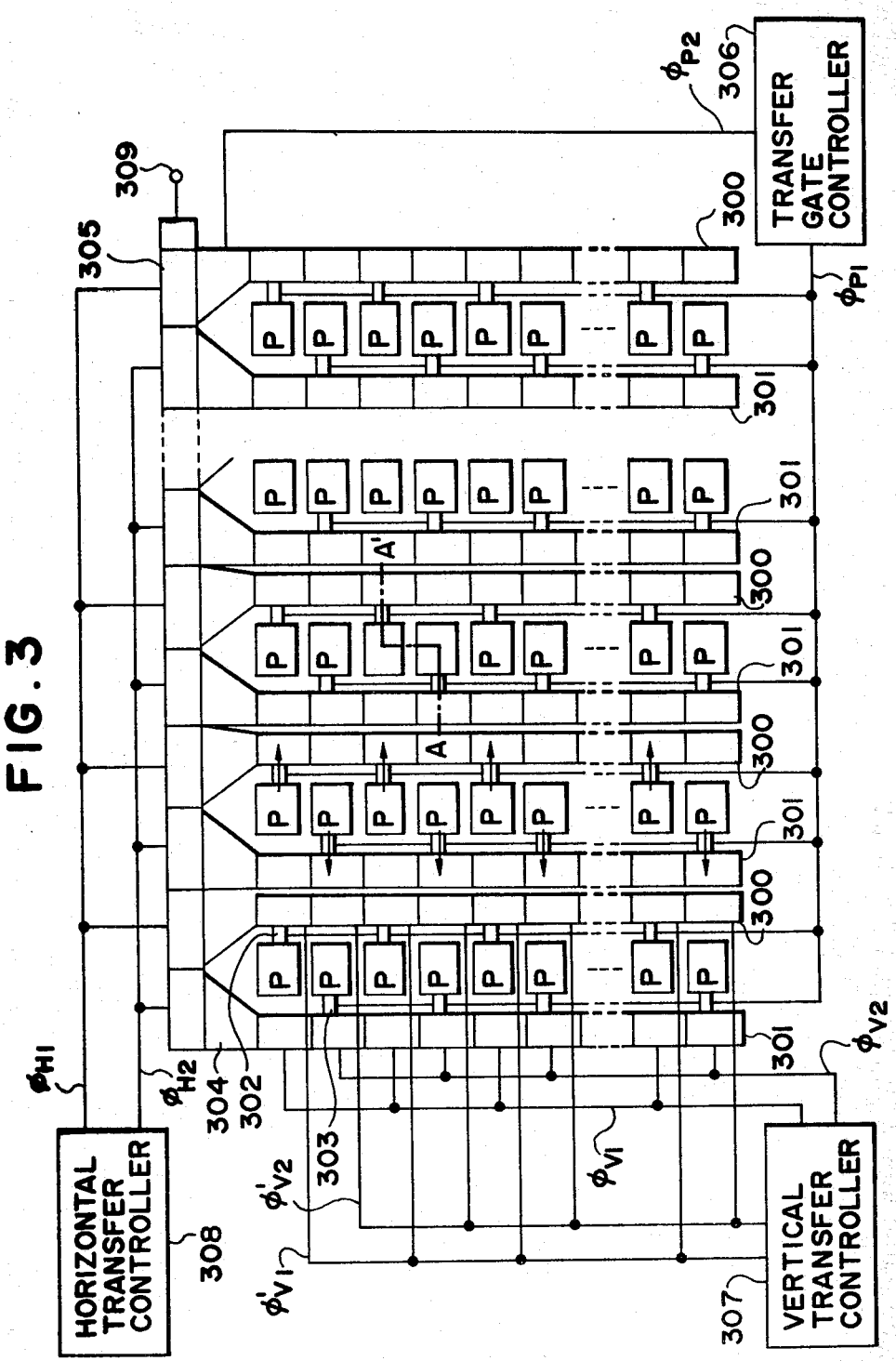
FIG. 3 is explanatory of the arrangement of an embodiment of the present invention.

FIG. 3 illustrates the arrangement of an embodiment of the present invention. Reference character P indicates optoelectro transducers, such as photo diodes; reference numerals 300 and 301 designate first and second vertical transfer analog registers formed by CCDs or BBDs; 302 and 303 identify first and second transfer gates; 304 denotes a vertical transfer gate; and 305 represents an horizontal transfer analog register formed by a CCD or BBD. The horizontal transfer analog register 305 and the first and second vertical transfer analog registers 300 and 301 are shielded from light and arranged so that signals therein are retained as they are even when the optoelectro transducers P are exposed to irradiation by light. Reference numeral 306 shows a transfer gate controller; 307 refers to a vertical transfer controller; 308 signifies a horizontal transfer controller; 309 indicates a video output terminal; $\phi_{P1}$ and $\phi_{P2}$ designate gate clocks; $\phi_{V1}$, $\phi_{V2}$, $\phi'_{V1}$ and $\phi'_{V2}$ identify vertical transfer clocks; and $\phi_{H1}$ and $\phi_{H2}$ denote horizontal transfer clocks.

In the two-dimensional solid-state image sensor of this embodiment, as illustrated in FIG. 3, the plurality of optoelectro transducers P are arranged in a matrix form and the first and second vertical transfer analog registers 300 and 301 are disposed corresponding to each column of the transducers.

The first transfer gate 302 is to transfer stored information of the optoelectro transducers P of the odd number rows to the first vertical transfer analog register 300. The second transfer gate 303 is to transfer stored information of the optoelectro transducers P of the even number rows to the second vertical transfer analog register 301. The first and second transfer gates 302 and 303 are both controlled by the gate clock $\phi_{P1}$ from the transfer controller 306 to open and close at the same timing.

The first and second vertical transfer analog registers 300 and 301 are to sequentially shift upwardly signals transferred from the optoelectro transducers P and send them via the vertical transfer gate 304 to the horizontal transfer analog register 305. The horizontal transfer analog register 305 carries out the parallel-serial conversion of the transferred signals to provide it as a video signal at the video output terminal 309. The first vertical transfer analog registers 300 controlled by the two-phase vertical transfer clocks $\phi_{V1}$ and $\phi_{V2}$ from the vertical transfer controller 307. The second vertical transfer analog registers 301 are controlled by the two-phase vertical transfer clocks $\phi'_{V1}$ and $\phi'_{V2}$ from the vertical transfer controller 307. The horizontal transfer analog registers 305 are controlled by the two-phase horizontal transfer clocks $\phi_{H1}$ and $\phi_{H2}$ form the horizontal transfer controller 308. The vertical transfer gates 304 are controlled by the gate clock $\phi_{P2}$ from the transfer gate controller 306.

Figure 4:
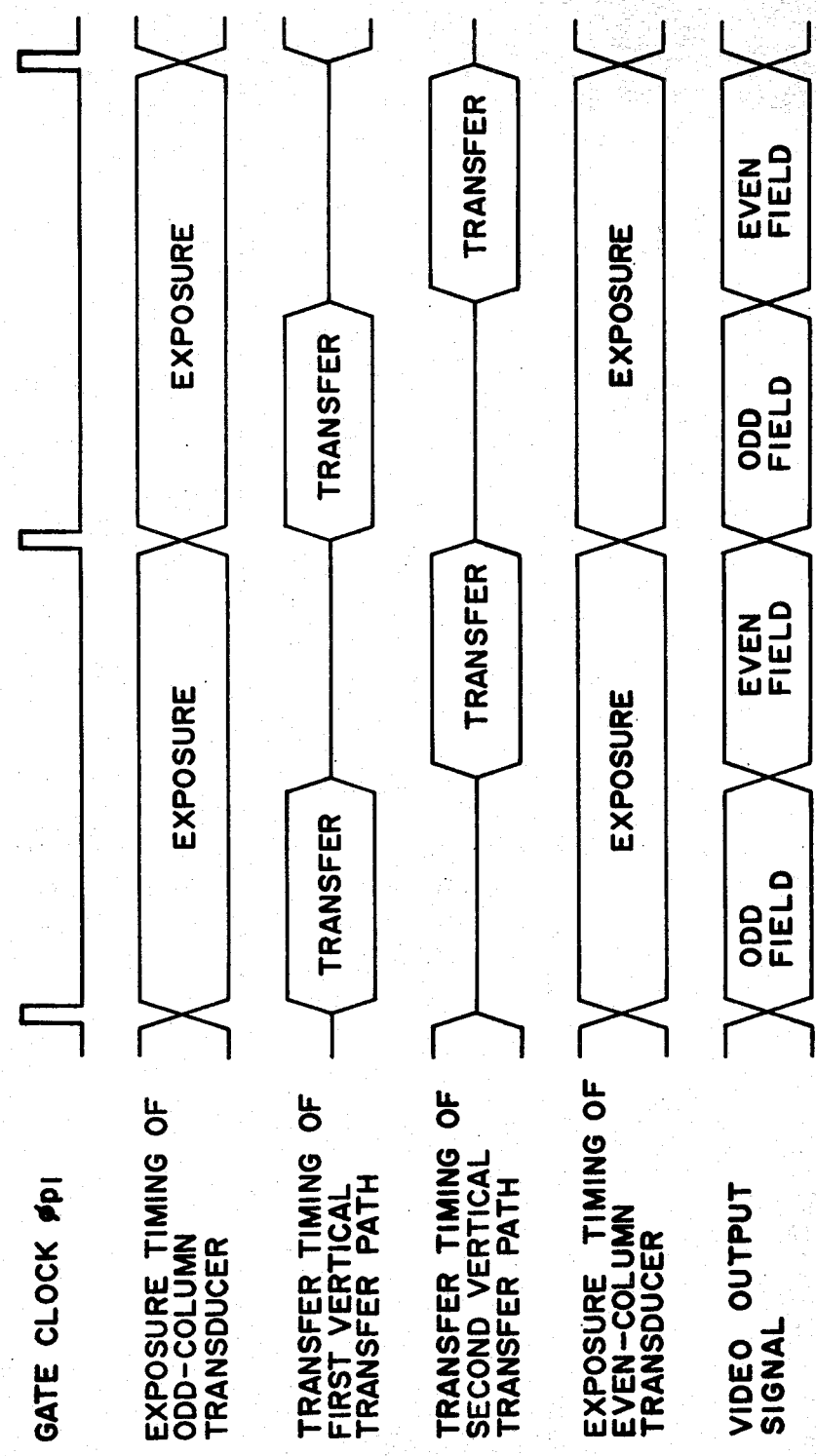
FIG. 4 is explanatory of the operation of the embodiment shown in FIG. 3.

FIG. 4 shows the exposure timing of the optoelectro transducers of the odd and even number rows, the transfer timing of the first and second vertical transfer analog registers 300 and 301 and variations in the video output signal with time in the case of the image sensor shown in FIG. 3 being operated.

As illustrated in FIG. 4, in the image sensor of this embodiment, the optoelectro transducers of the both odd and even rows are exposed to light at the same timing, and stored information of the optoelectro transducers of both odd and even number columns is also transferred to the first or second vertical transfer analog register 300 or 301 at the timing of the same gate clock $\phi_{P1}$. At first, the contents of the first vertical transfer analog registers 300 are sent by the clocks $\phi_{V1}$ and $\phi_{V2}$ via the vertical transfer gates 304 to the horizontal transfer registers analog 305, from which they are read out as a video signal of the odd number field. Next, the contents of the second vertical transfer analog registers 301 are transferred by the clocks $\phi'_{V1}$ and $\phi'_{V2}$ to the horizontal transfer analog registers 305, from which they are derived as a video signal of the even number field at the video output terminal 309. Since the first and second vertical transfer analog registers 300 and 301 transfer the signals without being affected by the irradiation of light as referred to previously, the optoelectro transducers of the odd and even number rows represent picture element information of the subject in the same period; consequently, even if one frame is formed with two fields by reproducing the odd and even number fields alternately, it is possible to obtain a still picture which is free from flickering and hence is of high picture quality.

Figure 5:
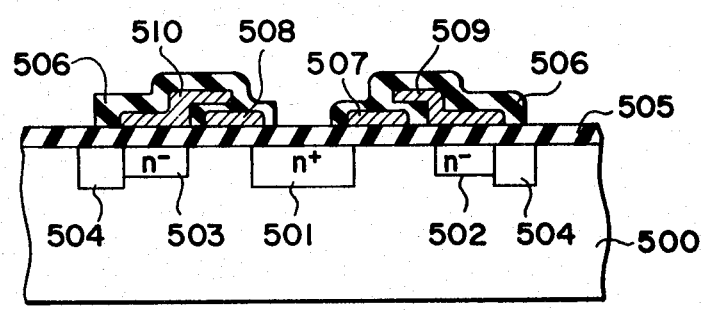
FIGS. 5 and 7 are sectional views illustrating different examples of an optoelectro transducer and a vertical transfer path used in the embodiment of FIG. 3.

FIG. 5 is a sectional view taken on the line A—A' in FIG. 3, showing, by way of example, the optoelectro transducer P and the first and second vertical transfer analog registers 300 and 301. In FIG. 5, reference numeral 500 indicates a P type semiconductor substrate; 501 designates an n+ type semiconductor region; 502 and 503 identify n− type semiconductor regions; 504 denotes channel stops; 505 and 506 represent insulating layers as of SiO$_2$; 507 and 506 show first and second transfer gate electrodes; and 509 and 510 refer to metal electrodes.

Figure 6:
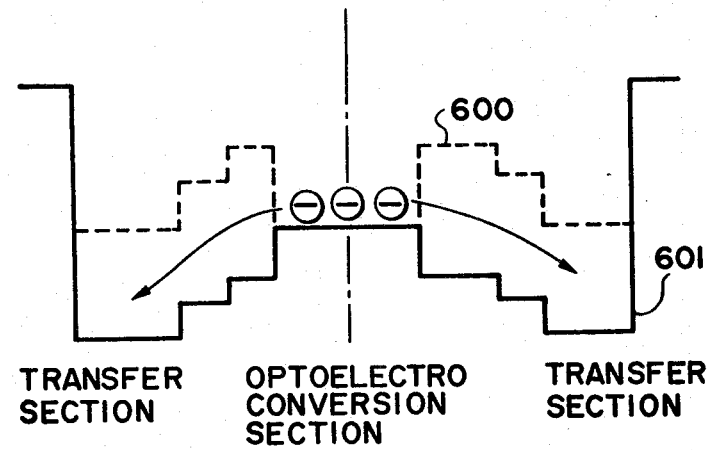
FIG. 6 is a diagram showing the potential of the optoelectro transducer shown in FIG. 5.

In the illustrated embodiment, a photo diode formed by the P type semiconductor substrate 500 and the n+ type semiconductor region 501 is used as the optoelectro transducer P; a burried channel type CCD composed of the n− type semiconductor region 503 and the metal electrode 509 is used as one element of the first vertical transfer register analog 300; and a burried channel type CCD composed of the n− type 503 and the metal electrode 510 is used as one element of the second vertical transfer analog register 301. FIG. 6 shows the potential of the element of FIG. 5. When no voltage is applied to the transfer gate electrodes 507 and 508, the optoelectro transducer section is surrounded by a potential barrier as indicated by the broken line 600 in FIG. 6 but, upon application of a voltage across the gate electrodes 507 and 508 and the metal electrodes 509 and 510, the potential barrier is lowered as indicated by the solid line 601, allowing stored charges in the optoelectro transducer section to flow to the transfer section. When to perform the vertical transfer, the voltage applied to the gate electrodes 507 and 508 is reduced to zero and the two-phase vertical transfer clocks $\phi_{V1}$, $\phi_{V2}$, $\phi'_{V1}$ and $\phi'_{V2}$ are provided to the metal electrodes 509 and 510, moving up and down only the potential depth of the transfer section.

Incidentally, with the arrangement in which two vertical transfer paths are provided corresponding to each column of optoelectro transducers as in the present invention, the aperture ratio inevitable lowers. Accordingly, it is preferable in the present invention to make the light receiving area of the element as large as possible. One method that meets such a requirement is to employ a solid-state image sensor element in which the gate electrodes 507 and 508 are omitted by equipping the metal electrodes 509 and 510 with the functions of the gate electrodes, thereby to provide for increased light receiving area. Another effective method is to employ a solid-state image sensor element of what is called a two-storied structure in which an optoelectro conversion material layer is deposited all over the surface of the element and a transfer path is provided thereunder as set forth in, for instance, Japanese Pat. Disc. No. 39404/80 or 27772/80 gazette.

Figure 7:
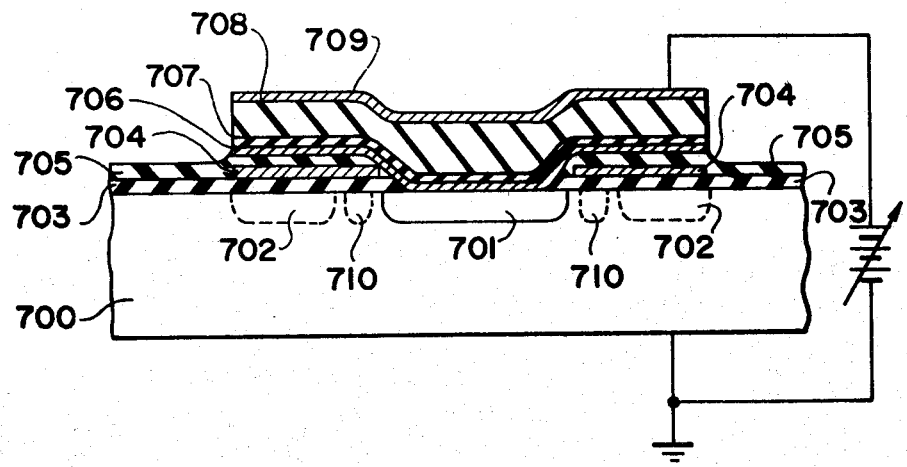

FIG. 7 is a sectional view taken on the line A—A' in FIG. 3, similar to FIG. 5, showing an example of the solid-state image sensor of the two-storied structure. This element comprises a P type semiconductor substrate 700, an n+ type region 701 formed in the substrate to constitute a diode, an n+ type region 702 which serves as a potential well in the case of a BBD operation, a gate electrode 704 formed on the n+ type region 702 to overlap the n+ type region 701 via a gate oxide film 703, an electrode 706 provided on the n+ type region 701 and electrically isolated by an insulating film 705 from the semiconductor substrate 700 and the gate electrode 704, a hole blocking layer 707 provided on the electrode 706, a photoconductor 708 deposited on the hole blocking layer 707 and formed of, for instance, $(Zn_{1-x}Cd_xTe)_{1-y}(in_2Te_3)y$, and a transparent electrode 709 deposited on the photoconductor 708. Electrons of electron-hole pairs created in the photoconductor 708 in accordance with the quantity of incident light are led via the electrode 706 to the n+ type region 701, from which they are transferred by activating the gate electrode 704 to the n+ type region 702. Since the photoconductor 708 serves as a light detecting portion, the aperture ratio is increased.

Figure 8:
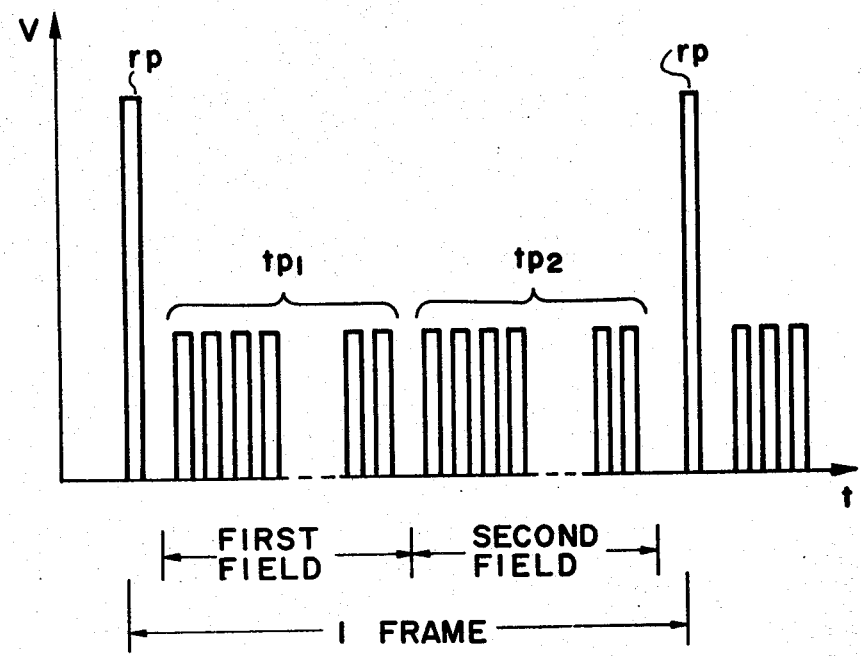
FIG. 8 is a graph showing the signal waveform for driving the optoelectro transducer depicted in FIG. 7.

FIG. 8 shows a waveform for driving the element of FIG. 7, upon application of a read pulse rp of high potential to the gate electrode 704, electrons are transferred from the n+ type region 701 to the n+ type region 702 and those of the electrons which correspond to the optoelectro transducers of the odd number columns are subjected to vertical transfer by a first transfer pulse train $tp_1$ of low potential applied to the gate electrode 704, whereas the electrons corresponding to the optoelectro transducers of the even number columns are subjected to vertical transfer by a second transfer pulse train $tp_2$.

When to operate the element of FIG. 7 as a CCD, a p+ type region 710 which serves as a potential barrier for blocking the injection of electrons from the n+ type region 701 is provided in place of the region 702.

As will be appreciated from the foregoing description, according to the present invention, two vertical transfer paths are provided for each column of optoelectro transducers; the optoelectro transducers of odd and even number columns are exposed to irradiation by light at the same timing and their information is concurrently transferred to the vertical transfer paths; and the information of transducers of the even number culumns is temporarily held in the vertical transfer paths and the information of the optoelectro transducers of the odd number columns is read out as a video signal of an odd number field first and then the information of the optoelectro transducers of the even number columns is read out as a video signal of an even field. Since the video signals of the odd and even number fields are of the same exposure timing, the present invention possesses the advantage that even if one picture frame is formed with two fields by reproducing the odd and even number fields alternately, a flicker-free still picture of high quality can be obtained.

The present invention is not limited specifically to the embodiments described in the foregoing. As for the arrangements of the optoelectro transducers and the vertical and horizontal transfer paths, it is possible to freely employ desired ones of known arrangements.

It will be apparent that many modifications and variations may be effected without departing from the scope of the novel concepts of the present invention.

What is claimed is:

1. A two-dimensional solid-state image sensor comprising:

a plurality of optoelectro transducers arranged in a matrix form;

first and second vertical transfer paths provided corresponding to each column of the optoelectro transducers;

a horizontal transfer path for serial-parallel converting signals transferred via the first and second vertical transfer paths to output the converted signals;

gate means for simultaneously transferring stored information of the optoelectro transducers of odd and even number rows to the first and second vertical transfer paths, respectively; and a transfer controller for performing transfer control of the first and second vertical transfer paths and the horizontal transfer path, by which the stored information of the optoelectro transducers of the odd number rows transferred to the first vertical transfer path is outputted as a video signal of an odd number field first and then the stored information of the optoelectro transducers of the even number rows transferred to the second vertical transfer path is outputted as a video signal of an even number field.

2. A two-dimensional solid-state image sensor according to claim 1 wherein the first and second vertical transfer paths and the horizontal transfer path are analog transfer registers formed by CCDs.

3. A two-dimensional solid-state image sensor according to claim 1 wherein the first and second vertical transfer paths and the horizontal transfer path are analog transfer registers formed by BBDs.

4. A two-dimensional solid-state image sensor according to claim 1 wherein an optoelectro conversion material layer is formed over the entire area of the surface of a semiconductor substrate and a transfer path is provided under the optoelectro conversion material layer.

* * * * *

UNITED STATES PATENT AND TRADEMARK OFFICE
CERTIFICATE OF CORRECTION

PATENT NO. : 4,455,575

DATED : June 19, 1984

INVENTOR(S) : Makoto Murakoshi

It is certified that error appears in the above-identified patent and that said Letters Patent is hereby corrected as shown below:

Column 5, line 41, "culumns" should be --columns--.

Signed and Sealed this

Twenty-fifth Day of December 1984

[SEAL]

Attest:

Attesting Officer

GERALD J. MOSSINGHOFF

Commissioner of Patents and Trademarks